(12) United States Patent
Park

(10) Patent No.: US 8,630,109 B2
(45) Date of Patent: Jan. 14, 2014

(54) MEMORY CELL AND MEMORY DEVICE INCLUDING THE SAME

(75) Inventor: Young-Jin Park, Incheon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 105 days.

(21) Appl. No.: 13/432,294

(22) Filed: Mar. 28, 2012

(65) Prior Publication Data
US 2012/0250390 A1  Oct. 4, 2012

(30) Foreign Application Priority Data
Mar. 29, 2011  (KR) .................. 10-2011-0027902

(51) Int. Cl.
*G11C 11/34* (2006.01)
*G11C 13/00* (2006.01)

(52) U.S. Cl.
USPC .......................................... 365/114; 365/106

(58) Field of Classification Search
USPC .................................. 365/106, 114
See application file for complete search history.

(56) References Cited

U.S. PATENT DOCUMENTS

| 6,071,671 A | 6/2000 | Glushko et al. |
| 6,873,593 B1 | 3/2005 | Pavel |
| 7,352,007 B2 | 4/2008 | Gilton |
| 7,727,786 B2 | 6/2010 | Gilton |

FOREIGN PATENT DOCUMENTS

JP  2000-0512061 A  9/2000

*Primary Examiner* — Ly D Pham
(74) *Attorney, Agent, or Firm* — Lee & Morse, P.C.

(57) ABSTRACT

A memory cell includes a light emitting unit, a phosphorescent layer, a polarization filter and a light detecting unit. The light emitting unit selectively generates a first light signal in response to a write data. The phosphorescent layer generates a second light signal using an energy absorbed from the first light signal. The polarization filter either passes the second light signal to output the passed second light signal as a third light signal or blocks out the second light signal in response to the write data. The light detecting unit generates a read data by detecting the third light signal.

20 Claims, 7 Drawing Sheets

MEMORY CELL AND MEMORY DEVICE INCLUDING THE SAME

CROSS-REFERENCE TO RELATED APPLICATION(S)

Korean Patent Application No. 10-2011-0027902, filed on Mar. 29, 2011 in the Korean Intellectual Property Office (KIPO), and entitled: "Memory Cell and Memory Device Including the Same" the contents of which are herein incorporated by reference in their entirety.

BACKGROUND

1. Field

Exemplary embodiments relate to a semiconductor device, and more particularly to a memory cell and a memory device including the memory cell.

2. Description of the Related Art

Generally, each memory cell included in a memory device has a capacitor. Each memory cell stores a data by charging the capacitor. However, charges stored in the capacitor are discharged as time goes on such that the memory cell looses the stored data. Therefore, the memory cell needs to be refreshed periodically.

A conventional memory cell including a capacitor is refreshed with a cycle of more than 100 MHz. While a refresh period may be relatively short, power consumption of the memory cell increases as a result of the refresh operation.

SUMMARY

One or more embodiments may provide a memory cell including a phosphorescent material.

One or more embodiments provide a memory device including the memory cell including a phosphorescent material.

One or more embodiments provide a memory cell includes a light emitting unit, a phosphorescent layer, a polarization filter and a light detecting unit. The light emitting unit selectively generates a first light signal in response to a write data. The phosphorescent layer generates a second light signal using an energy absorbed from the first light signal. The polarization filter either passes the second light signal to output the passed second light signal as a third light signal or blocks out the second light signal in response to the write data. The light detecting unit generates a read data by detecting the third light signal.

The memory cell may perform an erase operation by blocking out the second light signal with the polarization filter.

The light emitting unit may be turned on to generate the first light signal when the write data has a logic high level, and be turned off not to generate the first light signal when the write data has a logic low level.

The light emitting unit may include a light emitting diode (LED) that generates the first light signal in response to the write data.

The light emitting unit may include a laser generator that generates the first light signal in response to the write data.

The phosphorescent layer may generate the second light signal continuously during an extinction period when the phosphorescent layer absorbs the first light signal.

The memory cell may be refreshed with a refresh period that is less than the extinction period.

the polarization filter may be opened so that the polarization filter passes the second light signal to output the passed second light signal as the third light signal when the write data has a logic high level, and be closed so that the polarization filter blocks out the second light signal when the write data has a logic low level.

the light detecting unit may generate the read data having a logic high level when the light detecting unit detects the third light signal, and generate the read data having a logic low level when the light detecting unit does not detect the third light signal.

The light detecting unit may include a phototransistor that generates the read data by detecting the third light signal.

The light detecting unit may include a cadmium sulfide (CdS) photoconductive cell that generates the read data by detecting the third light signal.

The memory cell may further include an n-type metal oxide semiconductor (NMOS) transistor having a source coupled to both the light emitting unit and the polarization filter, a drain coupled to a bit line, and a gate coupled to a word line, where the light detecting unit may be coupled between the word line and the bit line.

The memory cell may further include a demultiplexer configured to provide a word line enable signal received through the word line to a first output electrode during a write mode, and to provide the word line enable signal to a second output electrode during a read mode, and an n-type metal oxide semiconductor (NMOS) transistor having a source coupled to both the light emitting unit and the polarization filter, a drain coupled to a bit line, and a gate coupled to the first output electrode of the demultiplexer, where the light detecting unit may be coupled between the second output electrode of the demultiplexer and the bit line.

The memory cell may further include an n-type metal oxide semiconductor (NMOS) transistor having a source coupled to both the light emitting unit and the polarization filter, a drain coupled to a bit line, and a gate coupled to a first word line, where the light detecting unit may be coupled between a second word line and the bit line, and a word line enable signal may be provided through the first word line during a write mode, and be provided through the second word line during a read mode.

One or more embodiments provide a memory device includes a memory cell array, a row decoder and a column decoder. The memory cell array includes a plurality of memory cells arranged in rows and columns. The row decoder selects a row among the rows of the memory cell array. The column decoder selects a column among the columns of the memory cell array. Each of the plurality of the memory cells includes a light emitting unit configured to selectively generate a first light signal in response to a write data, a phosphorescent layer configured to generate a second light signal using an energy absorbed from the first light signal, a polarization filter configured to either pass the second light signal to output the passed second light signal as a third light signal or block out the second light signal in response to the write data, and a light detecting unit configured to generate a read data by detecting the third light signal.

Each of the memory cells may not include any capacitor.

One or more embodiments provide a memory cell, including a phosphorescent layer configured to emit light during an extinction period based on a data signal, and a controller configured to control a supply of a light signal to a detecting unit based on the data signal, the light signal being based on the light emitted by the phosphorescent material.

The controller may be configured to prevent the supply of the light signal to the detecting unit during an erase operation.

The controller may be a polarization filter configured to selectively pass or block light emitted by the phosphorescent material as the light signal.

The memory cell may include a light emitting unit configured to generate the light signal, and a transistor coupled between the light emitting unit and a bit line and including a gate electrode coupled to a word line, wherein the light emitting unit is configured to generate a light signal based on a word line enable signal supplied to the transistor.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
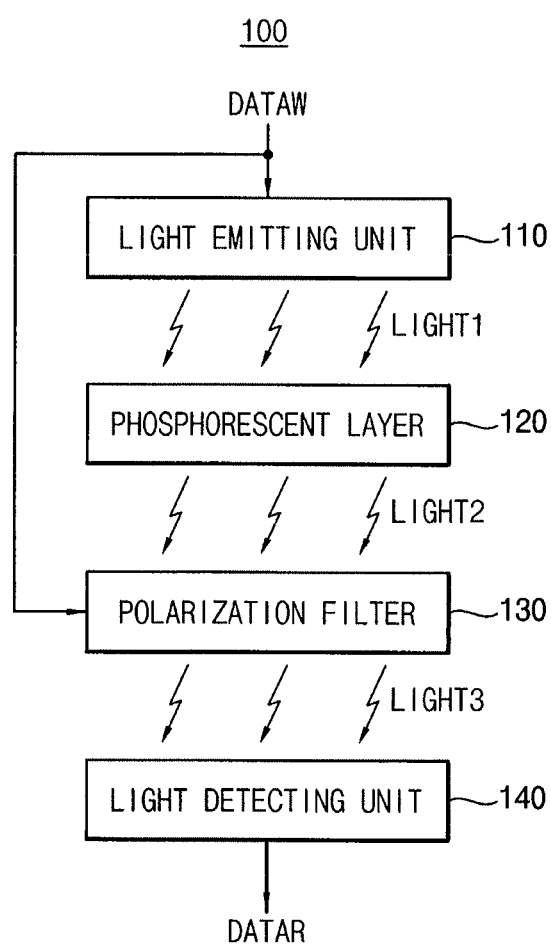
FIG. 1 illustrates a block diagram of an exemplary embodiment of a memory cell.

Various example embodiments will be described more fully with reference to the accompanying drawings, in which some example embodiments are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a block diagram of an exemplary embodiment of a memory cell 100.

Referring to FIG. 1, the memory cell 100 may include a light emitting unit 110, a phosphorescent layer 120, a polarization filter 130, and a light detecting unit 140.

The light emitting unit 110 may receive a write data DATAW from an external source. The light emitting unit 110 may selectively generate a first light signal LIGHT1 in response to the write data DATAW. For example, the light emitting unit 110 may be turned on to generate the first light signal LIGHT1 when the write data DATAW has a logic high level, and may be turned off not to generate the first light signal LIGHT1 when the write data DATAW has a logic low level.

The light emitting unit 110 may include any device that is able to generate a light signal, e.g., an infrared ray, a visible ray, an ultraviolet ray, an X-ray, etc. In some example embodiments, the light emitting unit 110 may include a light emitting diode (LED). In this case, the light emitting unit 110 may turn on the LED to generate the first light signal LIGHT1 when the write data DATAW has a logic high level, and the light emitting unit 110 may turn off the LED not to generate the first light signal LIGHT1 when the write data DATAW has a logic low level. In other example embodiments, the light emitting unit 110 may include a laser generator. In this case, the light emitting unit 110 may turn on the laser generator to generate the first light signal LIGHT1 when the write data DATAW has a logic high level, and the light emitting unit 110 may turn off the laser generator not to generate the first light signal LIGHT1 when the write data DATAW has a logic low level.

The phosphorescent layer 120 may generate a second light signal LIGHT2 when the phosphorescent layer 120 receives the first light signal LIGHT1. The phosphorescent layer 120 may generate the second light signal LIGHT2 using an energy absorbed from the first light signal LIGHT1. The phosphorescent layer 120 includes a phosphorescent material. For example, the phosphorescent layer 120 may include a phosphorescent material such as zinc sulfide (ZnS) and a metal complex containing iridium (Ir), ruthenium (Ru), platinum (Pt), osmium (Os), rhenium (Re), palladium (Pd), etc.

Generally, when a phosphorescent material absorbs a light signal, electrons included in the phosphorescent material are excited. The electrons in the excited state do not directly return to a ground state, but move to a metastable state. The electrons in the metastable state gradually return to the ground state during an extinction period such that the phosphorescent material emits a light signal continuously during the extinction period. The extinction period of the phosphorescent material may be from a few milliseconds to more than a day according to a substance included in the phosphorescent material.

Therefore, the phosphorescent layer 120 may generate the second light signal LIGHT2 continuously during an extinction period, which is determined according to a substance included in the phosphorescent layer 120, when the phosphorescent layer 120 absorbs the first light signal LIGHT1.

The polarization filter 130 may pass the second light signal LIGHT2 to output the passed second light signal as a third light signal LIGHT3 or may block out the second light signal LIGHT2 in response to the write data DATAW. For example, the polarization filter 130 may be opened so that the polarization filter 130 may pass the second light signal LIGHT2 to output the passed second light signal as the third light signal LIGHT3 when the write data DATAW has a logic high level. In one or more embodiments, the polarization filter 130 may be closed so that the polarization filter 130 may block out the second light signal LIGHT2 when the write data DATAW has a logic low level. When the polarization filter 130 is opened, the polarization filter 130 may be kept open until the polarization filter 130 receives the write data having a logic low level. When the polarization filter 130 is closed, the polarization filter 130 may be kept closed until the polarization filter 130 receives the write data having a logic high level.

In some example embodiments, the polarization filter 130 may include two polarizing plates. In this case, the polarization filter 130 may rotate at least one of the two polarizing plates based on the write data DATAW for selectively passing the second light signal LIGHT2 through the polarization filter 130. For example, when the write data DATAW has a logic high level, the polarization filter 130 may rotate at least one of the two polarizing plates such that a polarization axis of one polarizing plate is parallel to a polarization axis of the other polarizing plate to pass the second light signal LIGHT2. In one or more embodiments, when the write data DATAW has a logic low level, the polarization filter 130 may rotate at least one of the two polarizing plates such that a polarization axis of one polarizing plate is perpendicular to a polarization axis of the other polarizing plate to block out the second light signal LIGHT2.

In some other example embodiments, the polarization filter 130 may include two polarizing plates and liquid crystals disposed between the two polarizing plates, where a polarization axis of one polarizing plate is perpendicular to a polarization axis of the other polarizing plate. In this case, the polarization filter 130 may arrange the liquid crystals based on the write data DATAW for selectively passing the second light signal LIGHT2 through the polarization filter 130. For example, when the write data DATAW has a logic high level, the polarization filter 130 may arrange the liquid crystals to be parallel to the two polarizing plates such that the liquid crystals rotate a polarization axis by 90 degree. Therefore, the polarization filter 130 may pass the second light signal LIGHT2 to output the passed second light signal as the third light signal LIGHT3. Alternatively, when the write data DATAW has a logic low level, the polarization filter 130 may arrange the liquid crystals to be perpendicular to the two polarizing plates such that the liquid crystals do not rotate a polarization axis. Therefore, the polarization filter 130 may block out the second light signal LIGHT2.

The light detecting unit 140 may generate a read data DATAR by detecting the third light signal LIGHT3. For example, the light detecting unit 140 may generate the read data DATAR having a logic high level when the light detecting unit 140 detects the third light signal LIGHT3, and may generate the read data DATAR having a logic low level when the light detecting unit 140 does not detect the third light signal LIGHT3.

Figure 2:
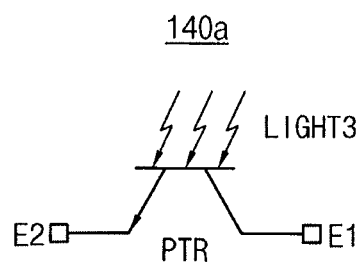
FIG. 2 illustrates a circuit diagram of an exemplary embodiment of a light detecting unit employable in the memory cell of FIG. 1.

FIG. 2 illustrates a circuit diagram of an exemplary embodiment of a light detecting unit 140 employable in the memory cell 100 of FIG. 1.

Referring to FIG. 2, a light detecting unit 140a may include a phototransistor PTR. The phototransistor PTR may generate the read data DATAR by detecting the third light signal LIGHT3.

A gate of the phototransistor PTR may include a photoelectric element. Therefore, when the gate of the phototransistor PTR receives the third light signal LIGHT3, the phototransistor PTR may be turned on such that a channel between a first electrode E1 and a second electrode E2 may be formed. A voltage signal having a logic high level may be applied to the first electrode E1 of the phototransistor PTR. Therefore, the light detecting unit 140a may generate the read data DATAR having a logic high level at the second electrode E2 of the phototransistor PTR when the light detecting unit 140a detects the third light signal LIGHT3, and may generate the read data DATAR having a logic low level at the second electrode E2 of the phototransistor PTR when the light detecting unit 140a does not detect the third light signal LIGHT3.

Figure 3:
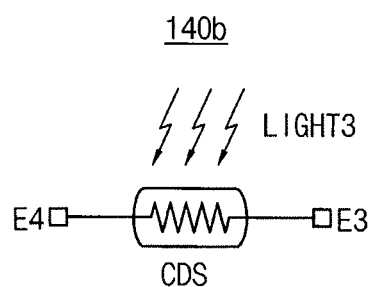
FIG. 3 illustrates a circuit diagram of another exemplary embodiment of a light detecting unit employable in the memory cell of FIG. 1.

FIG. 3 illustrates a circuit diagram of another exemplary embodiment of a light detecting unit 140 employable in the memory cell 100 of FIG. 1.

Referring to FIG. 3, a light detecting unit 140b may include a cadmium sulfide (CdS) photoconductive cell. The cadmium sulfide (CdS) photoconductive cell may generate the read data DATAR by detecting the third light signal LIGHT3.

Figure 4:
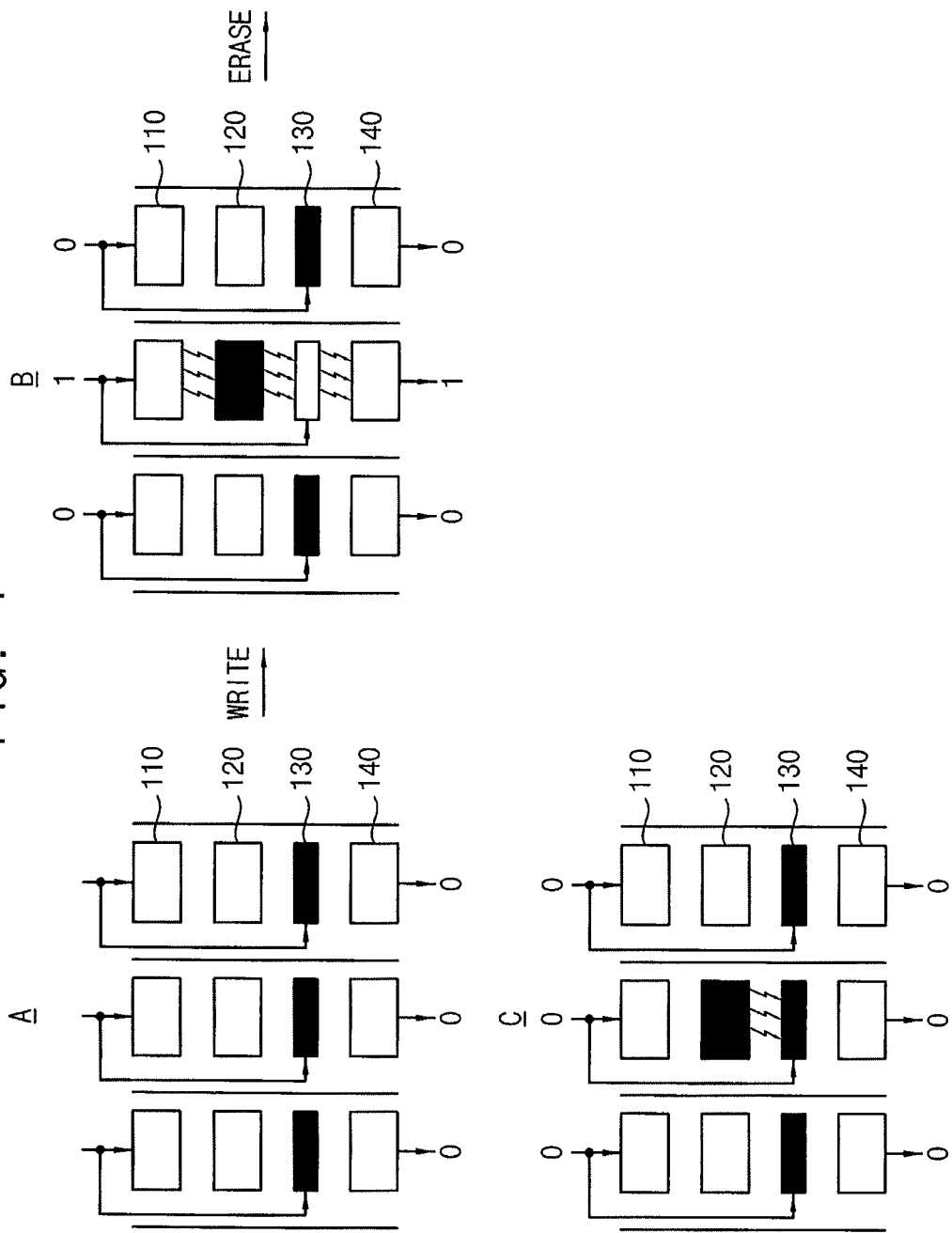
FIG. 4 illustrates a diagram for describing an exemplary operation of a memory cell of FIG. 1 according to an exemplary embodiment.

A resistance of the cadmium sulfide (CdS) photoconductive cell may decrease when the cadmium sulfide (CdS) photoconductive cell receives a light signal. Alternatively, a resistance of the cadmium sulfide (CdS) photoconductive cell may increase when the cadmium sulfide (CdS) photoconductive cell does not receive a light signal. Therefore, as illustrated in FIG. 4, a resistance between a third electrode E3 and a fourth electrode E4 decreases when the cadmium sulfide (CdS) photoconductive cell detects the third light signal LIGHT3, and a resistance between a third electrode E3 and a fourth electrode E4 increases when the cadmium sulfide (CdS) photoconductive cell does not detect the third light signal LIGHT3. A voltage signal having a logic high level may be applied to the third electrode E3 of the cadmium sulfide (CdS) photoconductive cell. Therefore, the light detecting unit 140b may generate the read data DATAR having a logic high level at the fourth electrode E4 of the cadmium sulfide (CdS) photoconductive cell when the light detecting unit 140b detects the third light signal LIGHT3, and generate the read data DATAR having a logic low level at the fourth electrode E4 of the cadmium sulfide (CdS) photoconductive cell when the light detecting unit 140b does not detect the third light signal LIGHT3.

Hereinafter, an exemplary operation of the memory cell 100 will be described.

In a write mode, to write '1' to the memory cell 100, the write data DATAW having a logic high level may be provided to the light emitting unit 110 and the polarization filter 130. The light emitting unit 110 is turned on to generate the first light signal LIGHT1 since the write data DATAW has a logic high level. The phosphorescent layer 120 absorbs the first light signal LIGHT1 and provides the second light signal LIGHT2 continuously during the extinction period. The polarization filter 130 is opened so that the polarization filter 130 may pass the second light signal LIGHT2 to output the passed second light signal as the third light signal LIGHT3 since the write data DATAW has a logic high level. A write operation of the memory cell 100 for writing '1' to the memory cell 100 may be performed by the processes described above.

In a write mode, to write '0' to the memory cell 100, the write data DATAW having a logic low level may be provided to the light emitting unit 110 and the polarization filter 130. The light emitting unit 110 is turned off not to generate the first light signal LIGHT1 since the write data DATAW has a logic low level. The phosphorescent layer 120 maintains a previous state since the phosphorescent layer 120 does not absorb the first light signal LIGHT1. That is, if the write data DATAW having a logic high level had been written in the memory cell 100 beforehand in a time window of the extinction period, the phosphorescent layer 120 may keep generating the second light signal LIGHT2. If the write data DATAW having a logic high level had not been written in the memory cell 100 beforehand during a time window of the extinction period, the phosphorescent layer 120 may continue to not generate the second light signal LIGHT2. The polarization filter 130 may be closed so that the polarization filter 130 blocks out the second light signal LIGHT2 since the write data DATAW has a logic low level. Therefore, the polarization filter 130 does not output the third light signal LIGHT3 regardless of whether the polarization filter 130 receives the second light signal LIGHT2 from the phosphorescent layer 120 or not. A write operation of the memory cell 100 for writing '0' to the memory cell 100 may be performed by the processes described above.

In a read mode, the light detecting unit 140 may generate the read data DATAR having a logic high level when the light detecting unit 140 detects the third light signal LIGHT3 received from the polarization filter 130, and may generate the read data DATAR having a logic low level when the light detecting unit 140 does not detect the third light signal LIGHT3. A read operation of the memory cell 100 may be performed by the processes described above.

An erase operation of the memory cell 100 may be performed by writing the write data DATAW having a logic low level to the memory cell 100. As described above, when the memory cell 100 stores '1', the phosphorescent layer 120 outputs the second light signal LIGHT2 and the polarization filter 130 is opened to output the third light signal LIGHT3. If the write data DATAW having a logic low level is written to the memory cell 100 that stores '1', the polarization filter 130 may be closed so that the polarization filter 130 does not output the third light signal LIGHT3 even though the phosphorescent layer 120 provides the second light signal LIGHT2 to the polarization filter 130. That is, the erase operation of the memory cell 100 may be performed by blocking out the second light signal LIGHT2 with the polarization filter 130. After the erase operation, the light detecting unit 140 may generate the read data DATAR having a logic low level in the read mode since the light detecting unit 140 does not detect the third light signal LIGHT3.

The phosphorescent layer 120 may generate the second light signal LIGHT2 continuously during the extinction period when the phosphorescent layer 120 absorbs the first light signal LIGHT1. That is, the phosphorescent layer 120 may not generate the second light signal LIGHT2 after the extinction period. Therefore, the memory cell 100 may be refreshed with a refresh period that is less than the extinction period, so that the memory cell 100 keeps a stored data. A refresh operation may be performed by reading the memory cell 100 to generate the read data DATAR and writing the write data DATAW having a logic high level to the memory cell 100 when the read data DATAR has a logic high level. When the read data DATAR has a logic low level, the memory cell 100 may not write the write data DATAW having a logic low level to the memory cell 100 during the refresh operation.

The refresh operation for the memory cell 100 storing '1' involves power consumption since the light emitting unit 110 is turned on to generate the first light signal LIGHT1. Therefore, while the refresh period is relatively short, power consumption of the memory cell 100 increases. As such, the refresh period of the memory cell 100 may be greater than half of the extinction period and less than the extinction period. The extinction period of the memory cell 100 may be from a few milliseconds to more than a day according to a substance included in the phosphorescent layer 120.

FIG. 4 illustrates a diagram for describing an exemplary operation of a memory cell of FIG. 1 according to an exemplary embodiment;

In FIG. 4 each of three diagrams A, B, C includes three memory cells 100 of FIG. 1 as an example.

In the diagrams A, B, C, the phosphorescent layer 120 having a white color does not generate the second light signal LIGHT2, and the phosphorescent layer 120 having a black color generates the second light signal LIGHT2. In the diagrams A, B, C, the polarization filter 130 having a white color is opened to pass the second light signal LIGHT2, and the polarization filter 130 having a black color is closed to block out the second light signal LIGHT2.

Referring to diagram A of FIG. 4, all three of the memory cells 100 stores '0' since all the polarization filters 130 are closed. Therefore, all three of the memory cells 100 in diagram A of FIG. 4 output read data DATAR having a logic low level in the read mode.

Referring to diagram B of FIG. 4, write data DATAW having a logic low level is written to a first memory cell and to a third memory cell, and write data DATAW having a logic high level is written to a second memory cell. In the case of the first memory cell and the third memory cell, the light emitting unit 110 is turned off and the polarization filter 130 is kept closed. In the case of the second memory cell, the light emitting unit 110 is turned on to generate the first light signal LIGHT1, the phosphorescent layer 120 absorbs the first light signal LIGHT1 to generate the second light signal LIGHT2, and the polarization filter 130 is opened to output the third light signal LIGHT3. Therefore, the first memory cell (left cell in diagram B) stores '0', the second memory cell (middle cell in diagram B) stores '1', and the third memory cell (right memory cell in diagram B) stores '0'. In the read mode, the first memory cell outputs read data DATAR having a logic low level, the second memory cell outputs read data DATAR having a logic high level, and the third memory cell outputs read data DATAR having a logic low level.

Referring to diagram C of FIG. 4, write data DATAW having a logic low level is provided to the second memory cell to perform an erase operation on the second memory cell. The light emitting unit 110 of the second memory cell is turned off and the polarization filter 130 of the second memory cell is closed. As illustrated in diagram C of FIG. 4, although the phosphorescent layer 120 continues to output the second light signal LIGHT2, the polarization filter 130 does not output the third light signal LIGHT3 since the polarization filter 130 blocks out the second light signal LIGHT2. Therefore, the second memory cell is erased so that all three of the memory cells in diagram C store '0'. In the read mode, all three of the memory cells output read data DATAR having a logic low level.

Conventional memory cells generally store data by charging a capacitor. However, charges stored in the capacitor are discharged over time such that the conventional memory cell loses the stored data over time. Therefore, the conventional memory cell needs to be refreshed periodically. While a refresh period may be relatively short, power consumption of the conventional memory cell increases since the refresh operation requires power and is performed repeatedly at a relatively high frequency. For example, conventional memory cells including a capacitor may be refreshed with a cycle of more than 100 MHz. Therefore, power consumption of the conventional memory cell is relatively high. In addition, when a supply voltage is cut off, data stored in the conventional memory cell is lost.

Referring again to FIGS. 1-4, in one or more embodiments of the memory cell 100, the phosphorescent layer 120 is employed to store a data, e.g., the phosphorescent layer 120 may be used instead of a capacitor. In one or more embodiments of the memory cell 100, if the extinction period of a substance included in the phosphorescent layer 120 is relatively long, e.g., a day, the memory cell 100 may be refreshed only once a day. As such, one or more embodiments of the memory cell 100 may enable power consumption to be decreased. In addition, even though a supply voltage is cut off, the memory cell 100 may maintain the stored data during the extinction period. Therefore, one or more embodiments of the memory cell 100 may be used as a non-volatile memory.

Figure 5:
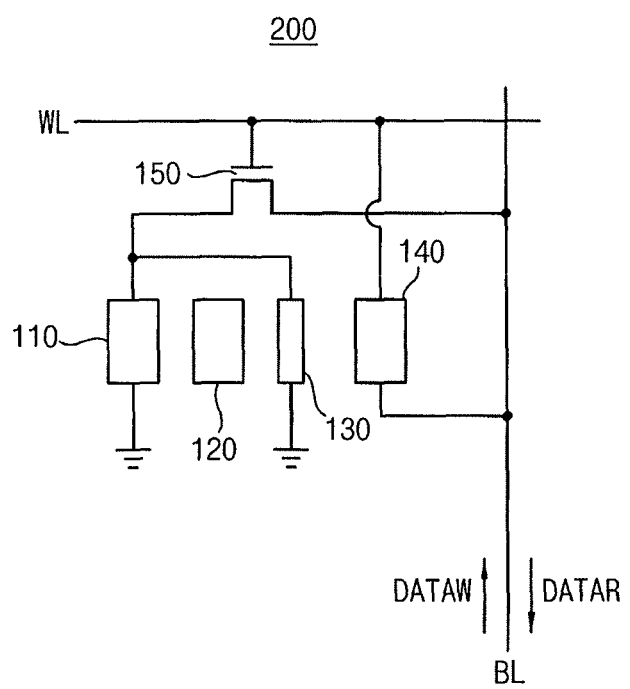
FIGS. 5, 6, and 7 illustrate block diagrams of exemplary embodiments of the memory cell of FIG. 1.

FIG. 5 illustrates a block diagram of a memory cell 200 as an exemplary embodiment of the memory cell 100 of FIG. 1. In general, only differences between the memory cell 100 of FIG. 1 and the memory cell 200 of FIG. 5 will be discussed below.

Referring to FIG. 5, the memory cell 200 may further include an n-type metal oxide semiconductor (NMOS) transistor 150. The NMOS transistor 150 may include a source coupled to both the light emitting unit 100 and the polarization filter 300, a drain coupled to a bit line BL, and a gate coupled to a word line WL.

The light detecting unit 140 may be coupled between the word line WL and the bit line BL.

In the write mode, a word line enable signal having a logic high level is provided to the NMOS transistor 150 through the word line WL, so that the NMOS transistor 150 is turned on. Write data DATAW may be provided through the bit line BL. The write data DATAW may be provided to the light emitting unit 110 and the polarization filter 130 through the NMOS transistor 150 since the NMOS transistor 150 is turned on. Therefore, the write operation may be performed as described above with reference to FIGS. 1 to 4. Although the light detecting unit 140 also receives the word line enable signal having a logic high level through the word line WL during the write operation, the light detecting unit 140 may not influence the write operation since a logic level of the bit line BL is fixed as a logic level of the write data DATAW.

In the read mode, a word line enable signal having a logic high level is provided to the light detecting unit 140 through the word line WL, so that the light detecting unit 140 generates the read data DATAR based on whether the light detecting unit 140 detects the third light signal LIGHT3 provided from the polarization filter 130 or not. The light detecting unit 140 may output the read data DATAR through the bit line BL. In the read mode, the word line enable signal having a logic high level is also provided to the NMOS transistor 150 through the word line WL, so that the NMOS transistor 150 is turned on. Therefore, the read data DATAR output from the light detecting unit 140 through the bit line BL is also provided to the light emitting unit 110 and the polarization filter 130 through the NMOS transistor 150. However, the read data DATAR, which is generated by reading a logic level of the memory cell 200, is written again in the memory cell 200.

Therefore, a logic level of a data stored in the memory cell 200 may be not changed. As such, although the NMOS transistor 150 is turned on in the read mode, the read operation may be performed correctly without changing a logic level of the stored data.

Figure 6:
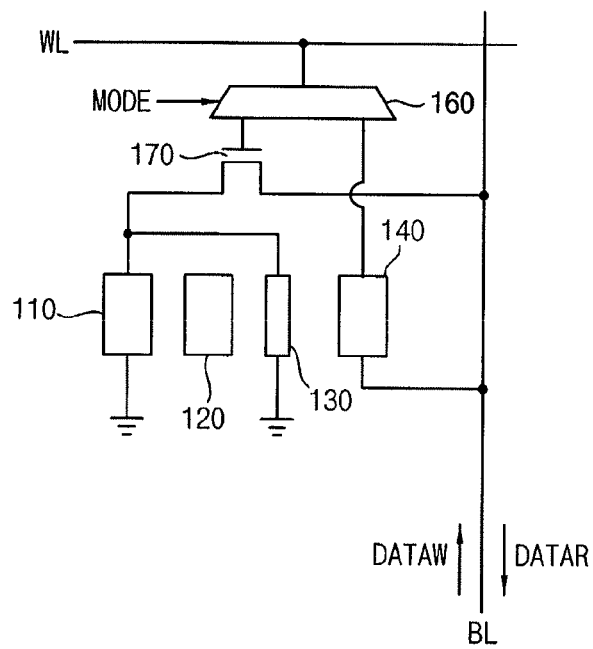

FIG. 6 illustrates a block diagram of a memory cell 300 as an exemplary embodiment of the memory cell 100 of FIG. 1. In general, only differences between the memory cell 100 of FIG. 1 and the memory cell 300 of FIG. 6 will be discussed below.

More particularly, referring to FIG. 6, the memory cell 300 may further include a demultiplexer 160 and an n-type metal oxide semiconductor (NMOS) transistor 170.

The demultiplexer 160 may receive a mode signal MODE representing an operation mode of the memory cell 300. For example, the mode signal MODE may have a first logic level in the write mode, and the mode signal MODE may have a second logic level in the read mode. The first logic level may be a logic high level, and the second logic level may be a logic low level. Alternatively, the first logic level may be a logic low level, and the second logic level may be a logic high level. The demultiplexer 160 may receive a word line enable signal through the word line WL. The demultiplexer 160 may provide the word line enable signal to one of a first output electrode and a second output electrode in response to the mode signal. The demultiplexer 160 may provide the word line enable signal to the first output electrode during the write mode, and may provide the word line enable signal to the second output electrode during the read mode.

The NMOS transistor 170 may include a source coupled to both the light emitting unit 100 and the polarization filter 130, a drain coupled to a bit line BL, and a gate coupled to the first output electrode of the demultiplexer 160.

The light detecting unit 140 may be coupled between the second output electrode of the demultiplexer 160 and the bit line BL.

In a write mode, the demultiplexer 160 may receive the word line enable signal having a logic high level through the word line WL, and may provide the word line enable signal having a logic high level to the gate of the NMOS transistor 170, so that the NMOS transistor 170 is turned on. The write data DATAW may be provided through the bit line BL. The write data DATAW may be provided to the light emitting unit 110 and the polarization filter 130 through the NMOS transistor 170 since the NMOS transistor 170 is turned on. Therefore, the write operation may be performed as described above with reference to FIGS. 1 to 4. In the write mode, the word line enable signal is not provided to the light detecting unit 140 so that the light detecting unit 140 is not activated. Therefore, the light detecting unit 140 may not influence the write operation.

In a read mode, the demultiplexer 160 may receive the word line enable signal having a logic high level through the word line WL, and may provide the word line enable signal having a logic high level to the light detecting unit 140. Therefore, the light detecting unit 140 may generate the read data DATAR based on whether the light detecting unit 140 detects the third light signal LIGHT3 provided from the polarization filter 130. The light detecting unit 140 may output the read data DATAR through the bit line BL. In the read mode, the word line enable signal is not provided to the gate of the NMOS transistor 170 so that the NMOS transistor 170 is not turned on. Therefore, the read operation may be performed correctly without changing a logic level of the stored data.

Figure 7:
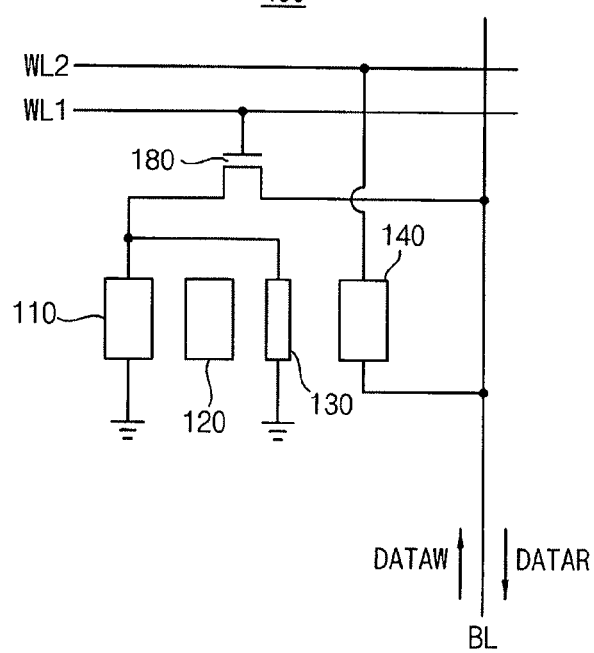

FIG. 7 illustrates a block diagram of a memory cell 400 as an exemplary embodiment of the memory cell 100 of FIG. 1.

In general, only differences between the memory cell 100 of FIG. 1 and the memory cell 400 of FIG. 7 will be discussed below.

Referring to FIG. 7, the memory cell 400 may further include an n-type metal oxide semiconductor (NMOS) transistor 180.

The NMOS transistor 180 may include a source coupled to both the light emitting unit 100 and the polarization filter 300, a drain coupled to a bit line BL, and a gate coupled to a first word line WL1.

The light detecting unit 140 may be coupled between a second word line WL2 and the bit line BL.

A word line enable signal may be provided through the first word line WL1 in a write mode, and the word line enable signal may be provided through the second word line WL2 in a read mode.

In the write mode, the word line enable signal having a logic high level is provided to the NMOS transistor 180 through the first word line WL1, so that the NMOS transistor 180 is turned on. The write data DATAW may be provided through the bit line BL. The write data DATAW may be provided to the light emitting unit 110 and the polarization filter 130 through the NMOS transistor 180 since the NMOS transistor 180 is turned on. Therefore, the write operation may be performed as described above with reference to FIGS. 1 to 4. In the write mode, the word line enable signal is not provided to the light detecting unit 140 so that the light detecting unit 140 is not activated since the word line enable signal is not provided through the second word line WL2. Therefore, the light detecting unit 140 may not influence the write operation.

In the read mode, the word line enable signal having a logic high level is provided to the light detecting unit 140 through the second word line WL2, so that the light detecting unit 140 generates the read data DATAR based on whether the light detecting unit 140 detects the third light signal LIGHT3 provided from the polarization filter 130. The light detecting unit 140 may output the read data DATAR through the bit line BL. In the read mode, the word line enable signal is not provided to the gate of the NMOS transistor 180 so that the NMOS transistor 170 is not turned on since the word line enable signal is not provided through the first word line WL1. Therefore, the read operation may be performed correctly without changing a logic level of the stored data.

Figure 8:
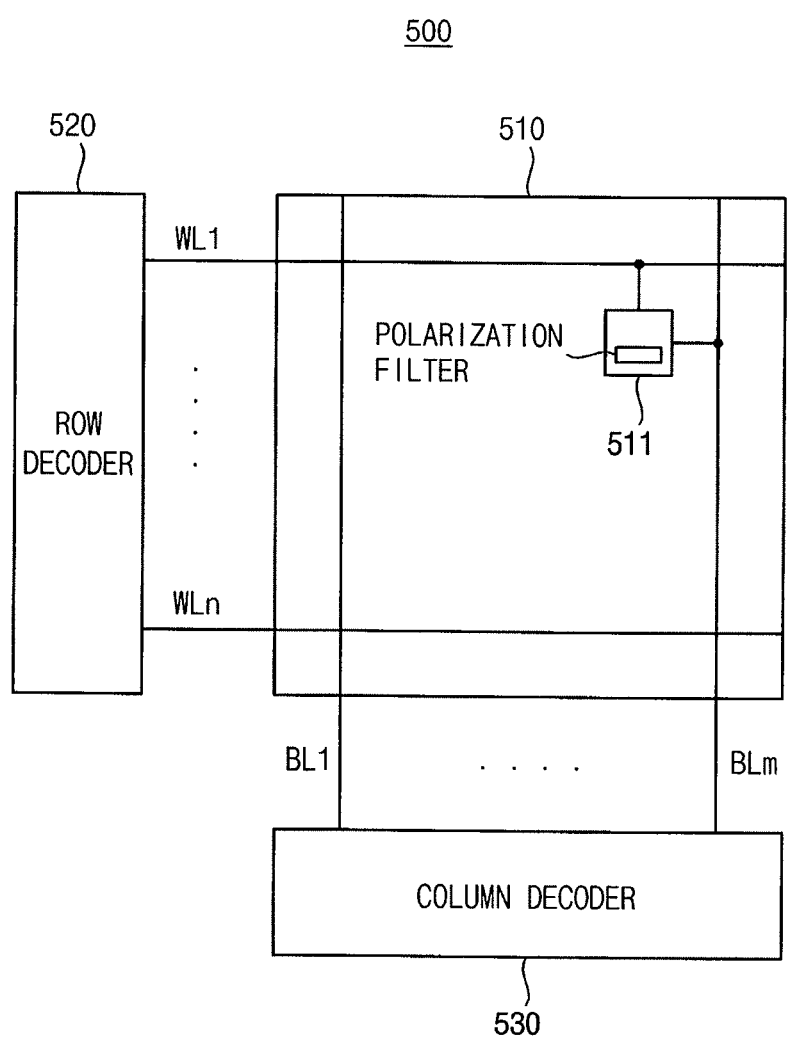
FIG. 8 illustrates a block diagram of an exemplary embodiment of a memory device employing a memory cell including one or more features described herein.

FIG. 8 illustrates a block diagram of an exemplary embodiment of a memory device 500 employing a memory cell including one or more features described herein.

Referring to FIG. 8, the memory device 500 may include a memory cell array 510, a row decoder 520, and a column decoder 530.

The memory cell array 510 may include a plurality of memory cells 511 arranged in rows and columns. The plurality of the memory cells 511 may be coupled between a plurality of word lines WL1, . . . , WLn and a plurality of bit lines BL1, . . . , BLm, respectively, where n and m are positive integers.

The row decoder 520 may be coupled to the memory cell array 510 through the plurality of the word lines WL1, . . . , WLn. The row decoder 520 may select a row among the rows of the memory cell array 510 by applying a word line enable signal having a logic high level to one of the word lines WL1, . . . , WLn.

The column decoder 530 may be coupled to the memory cell array 510 through the plurality of the bit lines BL1, . . . , BLm. The column decoder 530 may select a column among the columns of the memory cell array 510 by selecting one of the bit lines BL1, . . . , BLm.

In some example embodiments, each of the word lines WL1, . . . , WLn may include two sub word lines.

In one or more embodiments, each of the plurality of the memory cells 511 may be embodied with, e.g., one of the memory cell 200 of FIG. 5, the memory cell 300 of FIG. 6, and the memory cell 400 of FIG. 7. A structure and an operation of the memory cells 200, 300, 400 are described above with reference to FIGS. 1 to 7. Therefore, a detailed description of the memory cells 511 will not be repeated.

The memory device 500 may perform an erase operation on the memory cells 511 by blocking out the second light signal LIGHT2 generated by the phosphorescent layer 120 with the polarization filter 130 included in each of the memory cells 511.

Figure 9:
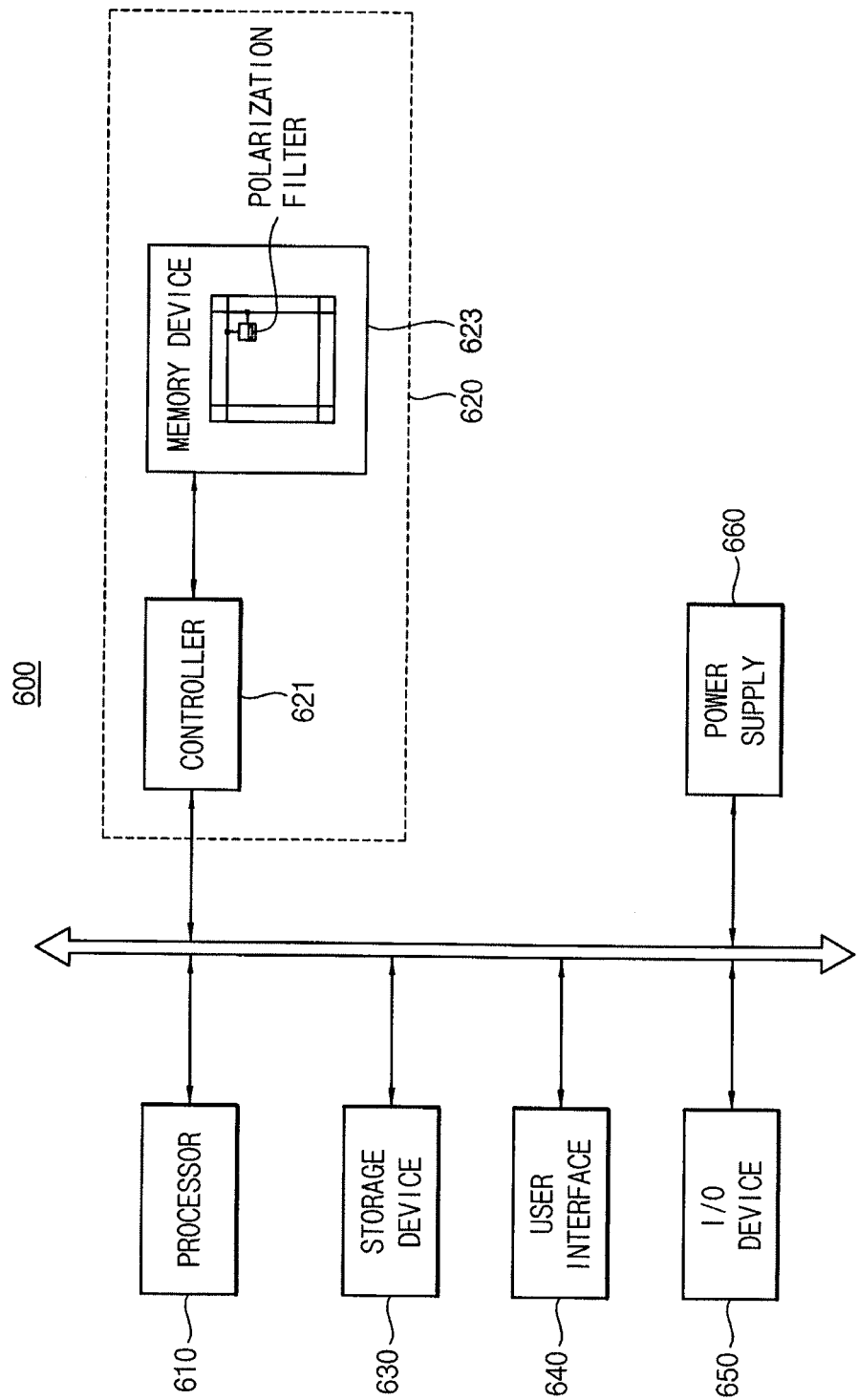
FIG. 9 illustrates a block diagram of an exemplary embodiment of a system employing a memory device employing one or more features described herein.

FIG. 9 illustrates a block diagram of an exemplary embodiment of a system 600 employing a memory device employing one or more features described herein.

Referring to FIG. 9, the system 600 may include a processor 610 and a memory system 620. The memory system 620 may include a memory controller 621 and a memory device 623.

In one or more embodiments, the memory device 623 may be embodied with, e.g., the memory device 500 of FIG. 8. Therefore, the memory device 623 may perform the erase operation on each of memory cells by blocking out the second light signal LIGHT2 generated by the phosphorescent layer 120 with the polarization filter 130 included in each of the memory cells. A structure and an operation of the memory device 500 are described above with reference to FIGS. 1 to 8. Therefore, a detailed description of the memory device 623 will not be repeated.

The memory controller 621 may control an operation of the memory device 623. The memory controller 621 may transfer a data between the processor 610 and the memory device 623.

The memory device 623 and/or the memory controller 621 may be mounted together using various packages. For example, the memory device 623 and/or the memory controller 621 may be mounted using Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), etc.

The processor 610 may control the memory system 620. That is, the processor 610 may write data to the memory system 620 and read the data from the memory system 620.

The processor 610 may perform various computing functions, such as executing specific software for performing specific calculations or tasks. For example, the processor 610 may be a microprocessor, a central process unit, etc. The processor 610 may be connected to the memory system 620 via a bus such as an address bus, a control bus, a data bus, etc. The processor 610 may be connected to an extended bus, such as peripheral component interconnect (PCI) bus.

The processor 610 may be embodied as a single core architecture or a multi core architecture. For example, the processor 610 may be embodied as a single core architecture when an operating frequency of the processor 610 is less than 1 GHz, and the processor 610 may be embodied as a multi core architecture when an operating frequency of the processor 610 is greater than 1 GHz. The processor 610 that is embodied as a multi core architecture may communicate with peripheral devices via an advanced extensible interface (AXI) bus.

The system 600 may further include a storage device 630, a user interface 640, an input/output device 650 and a power supply 660. Although not illustrated in FIG. 9, the system 600 may further include ports to communicate with a video card, a sound card, a memory card, a universal serial bus (USB) device, etc.

The storage device 630 may include a solid state drive (SSD), a hard disk drive (HDD), a compact disk read-only memory (CD-ROM) drive, etc. The user interface 640 may include devices required for a user to control the system 600. The input/output device 650 may include an input device (e.g., a keyboard or a mouse), an output device (e.g., a printer or a monitor). The power supply 660 may provide operational power.

The system 600 may be a mobile device, a smart phone, a cellular phone, a desktop computer, a laptop computer, a work station, a handheld device, a digital camera, or the like.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory cell, comprising:
   a light emitting unit configured to selectively generate a first light signal in response to a write data;
   a phosphorescent layer configured to generate a second light signal using an energy absorbed from the first light signal;
   a polarization filter configured to pass the second light signal and output the passed second light signal as a third light signal or to block out the second light signal in response to the write data; and
   a light detecting unit configured to generate a read data by detecting the third light signal.

2. The memory cell as claimed in claim 1, wherein the memory cell is configured to perform an erase operation by blocking out the second light signal with the polarization filter.

3. The memory cell as claimed in claim 1, wherein the light emitting unit is turned on to generate the first light signal when the write data has a logic high level, and is turned off not to generate the first light signal when the write data has a logic low level.

4. The memory cell as claimed in claim 1, wherein the light emitting unit includes a light emitting diode (LED) that generates the first light signal in response to the write data.

5. The memory cell as claimed in claim 1, wherein the light emitting unit includes a laser generator that generates the first light signal in response to the write data.

6. The memory cell as claimed in claim 1, wherein the phosphorescent layer generates the second light signal continuously during an extinction period when the phosphorescent layer absorbs the first light signal.

7. The memory cell as claimed in claim 6, wherein the memory cell is refreshed during a refresh period that is shorter than the extinction period.

8. The memory cell as claimed in claim 1, wherein the polarization filter is opened so as to pass the second light signal and output the passed second light signal as the third light signal when the write data has a logic high level, and is closed so as to block out the second light signal when the write data has a logic low level.

9. The memory cell as claimed in claim 1, wherein the light detecting unit generates the read data having a logic high level when the light detecting unit detects the third light signal, and generates the read data having a logic low level when the light detecting unit does not detect the third light signal.

10. The memory cell as claimed in claim 1, wherein the light detecting unit includes a phototransistor that generates the read data by detecting the third light signal.

11. The memory cell as claimed in claim 1, wherein the light detecting unit includes a cadmium sulfide (CdS) photoconductive cell that is configured to generate the read data by detecting the third light signal.

12. The memory cell as claimed in claim 1, further comprising:
   an n-type metal oxide semiconductor (NMOS) transistor having a source coupled to both the light emitting unit and the polarization filter, a drain coupled to a bit line, and a gate coupled to a word line,
   wherein the light detecting unit is coupled between the word line and the bit line.

13. The memory cell as claimed in claim 1, further comprising:
   a demultiplexer configured to provide a word line enable signal received through the word line to a first output electrode during a write mode, and to provide the word line enable signal to a second output electrode during a read mode; and
   an n-type metal oxide semiconductor (NMOS) transistor having a source coupled to both the light emitting unit and the polarization filter, a drain coupled to a bit line, and a gate coupled to the first output electrode of the demultiplexer,
   wherein the light detecting unit is coupled between the second output electrode of the demultiplexer and the bit line.

14. The memory cell as claimed in claim 1, further comprising:
   an n-type metal oxide semiconductor (NMOS) transistor having a source coupled to both the light emitting unit and the polarization filter, a drain coupled to a bit line, and a gate coupled to a first word line,
   wherein the light detecting unit is coupled between a second word line and the bit line, and
   wherein a word line enable signal is provided through the first word line during a write mode, and is provided through the second word line during a read mode.

15. A memory device, comprising:
   a memory cell array including a plurality of memory cells arranged in rows and columns;
   a row decoder configured to select a row among the rows of the memory cell array; and
   a column decoder configured to select a column among the columns of the memory cell array,
   wherein each of the plurality of memory cells includes:
   a light emitting unit configured to selectively generate a first light signal in response to a write data;

a phosphorescent layer configured to generate a second light signal using an energy absorbed from the first light signal;

a polarization filter configured to either pass the second light signal and output the passed second light signal as a third light signal or block out the second light signal in response to the write data; and a light detecting unit configured to generate a read data by detecting the third light signal.

16. The memory device as claimed in claim 15, wherein each of the memory cells is capacitor-less.

17. A memory cell, comprising:

a phosphorescent material configured to emit light during an extinction period based on a data signal; and a controller configured to control a supply of a light signal to a detecting unit based on the data signal, the light signal being based on the light emitted by the phosphorescent material.

18. The memory cell as claimed in claim 17, wherein the controller is configured to prevent the supply of the light signal to the detecting unit during an erase operation.

19. The memory cell as claimed in claim 17, wherein the controller is a polarization filter configured to selectively pass or block light emitted by the phosphorescent material as the light signal.

20. The memory cell as claimed in claim 17, further comprising:

a light emitting unit configured to generate the light signal; and a transistor coupled between the light emitting unit and a bit line and including a gate electrode coupled to a word line, wherein the light emitting unit is configured to generate a light signal based on a word line enable signal supplied to the transistor.

* * * * *